United States Patent
Ko

(10) Patent No.: US 8,647,931 B2
(45) Date of Patent: Feb. 11, 2014

(54) MANUFACTURING METHOD FOR DISPLAY DEVICE HAVING A PLURALITY OF THIN FILM TRANSISTORS AND DISPLAY DEVICE FORMED THEREBY

(75) Inventor: Moo-Soon Ko, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/415,759

(22) Filed: Mar. 8, 2012

(65) Prior Publication Data

US 2013/0069070 A1 Mar. 21, 2013

(30) Foreign Application Priority Data

Sep. 19, 2011 (KR) .................. 10-2011-0094115

(51) Int. Cl.
*H01L 27/15* (2006.01)
(52) U.S. Cl.
USPC ............ 438/149; 438/154; 438/197; 438/311
(58) Field of Classification Search
USPC ............... 257/E21.094, E21.104, E21.121, 257/E21.372, E21.411–E21.416; 438/149
See application file for complete search history.

(56) References Cited

U.S. PATENT DOCUMENTS

| 2006/0006469 A1* | 1/2006 | Hwang ............... 257/351 |
| 2006/0278875 A1* | 12/2006 | Ohnuma et al. .......... 257/66 |
| 2007/0001225 A1* | 1/2007 | Ohnuma et al. .......... 257/347 |
| 2008/0135849 A1* | 6/2008 | Yamayoshi ................ 257/66 |
| 2010/0015764 A1* | 1/2010 | Ohnuma et al. .......... 438/155 |
| 2013/0071963 A1* | 3/2013 | Choi ..................... 438/34 |

FOREIGN PATENT DOCUMENTS

| JP | 2008-116691 A | | 5/2008 |
| JP | 2008116691 A | * | 5/2008 |
| KR | 10-2006-0057769 A | | 5/2006 |
| KR | 10-2006-0109638 A | | 10/2006 |

* cited by examiner

*Primary Examiner* — Chuong A. Luu
*Assistant Examiner* — Jaehwan Oh
(74) *Attorney, Agent, or Firm* — Knobbe Martens Olson & Bear LLP

(57) ABSTRACT

A manufacturing method of a thin film transistor includes: forming semiconductor layers for a plurality of thin film transistors over a substrate; forming an insulating layer covering the semiconductor layers; and forming a metal layer over the insulating layer. The method further includes: patterning the metal layer to form mask patterns; doping first ions using a first mask pattern among the mask patterns into a first semiconductor layer among the semiconductor layers to simultaneously form source region/a drain regions and an active region of the first thin film transistor; and doping second ions using a second mask pattern among the mask patterns into a second semiconductor layer among the semiconductor layers to form a source region and a drain region of the second thin film transistor.

17 Claims, 5 Drawing Sheets

MANUFACTURING METHOD FOR DISPLAY DEVICE HAVING A PLURALITY OF THIN FILM TRANSISTORS AND DISPLAY DEVICE FORMED THEREBY

RELATED APPLICATIONS

This application claims priority to and the benefit of Korean Patent Application No. 10-2011-0094115 filed in the Korean Intellectual Property Office on Sep. 19, 2011, the entire content of which is incorporated herein by reference.

BACKGROUND

1. Field

An embodiment of the present invention relates to a manufacturing method of a thin film transistor.

2. Description of the Related Art

Flat panel displays such as, organic light emitting diode (OLED) displays and liquid crystal displays (LCD) include thin film transistors for driving. For smooth operation of these devices, the thin film transistors need to be manufactured to have good quality.

In manufacturing process of the display devices, when forming the thin film transistors, a photoresist is used as a mask for ion injection process.

However, when using such photoresist, unnecessary mobile ions can be moved into the semiconductor layer from the photoresist, and negatively influence to the operation of thin film transistors.

Also, a process for removing the used photoresist mask can make productivity low as the number of processes increases, and the thin film transistors may be contaminated during a cleaning process following removal of the photoresist.

The above information disclosed in this Background section is only for enhancement of understanding of the background of the invention and therefore it may contain information that does not form the prior art that is already known in this country to a person of ordinary skill in the art.

SUMMARY

An embodiment of the present invention provides a manufacturing method of a thin film transistor that forms the thin film transistor without usage of a photoresist mask when injecting ions for forming the thin film transistor, and a display device including the thin film transistor manufactured thereby.

A manufacturing method of a thin film transistor according to an embodiment of the present invention includes: forming semiconductor layers for a plurality of thin film transistors over a substrate; forming an insulating layer covering the semiconductor layers over the substrate; forming a metal layer over the insulating layer; patterning the metal layer to form mask patterns, each of which corresponds to one of the semiconductor layers; doping first ions using a first mask pattern among the mask patterns into a first semiconductor layer among the semiconductor layers to simultaneously form a source region/a drain region and an active region of a first thin film transistor; and doping second ions using a second mask pattern among the mask patterns into a second semiconductor layer among the semiconductor layers to form a source region and a drain region of a second thin film transistor.

When forming the source region/drain region and the active region of the first thin film transistor, the second semiconductor layer and the second mask pattern may be covered by a photoresist.

When forming the source region and the drain region of the second thin film transistor, the first semiconductor layer and the first mask pattern may be covered by a photoresist.

The first mask pattern may have a thickness substantially different from that of and the second mask pattern.

The thickness of the first mask pattern may be smaller than the thickness of the second mask pattern.

The first mask pattern and the second mask pattern may be formed by half-tone exposure.

The first mask pattern and the second mask pattern may be respectively formed as a gate electrode of the first thin film transistor and a gate electrode of the second thin film transistor, respectively.

The first thin film transistor may be an NMOS thin film transistor and the second thin film transistor may be a PMOS thin film transistor.

A display device according to an embodiment of the present invention includes a thin film transistor manufactured by the above manufacturing method of the above thin film transistor.

The display device may be an organic light emitting diode (OLED) display or a liquid crystal display (LCD).

According to an embodiment of the present invention, a metal layer is used as masks when injecting the ions for forming the thin film transistor without usage of a photoresist such that unnecessary movement of ions into the semiconductor layer may be prevented, thereby manufacturing a thin film transistors having good quality. Accordingly, the display device including the thin film transistors manufactured according to the present embodiment stably operate such that good quality images may be realized by the thin film transistors.

Also, the threshold voltage (Vth) may be precisely controlled by the effect of the channel doping through the active region doping process of the thin film transistor.

Further, forming the active region and the source/drain region for the thin film transistor may be accomplished through a single process, and the productivity may be improved for the process simplification.

In addition, the thin film transistor and the wire have different thicknesses such that resistance of the wire is not decreased.

DETAILED DESCRIPTION

Figure 1:
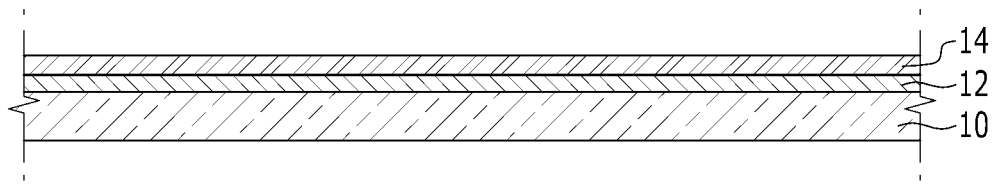
FIG. 1 to FIG. 9 are cross-sectional views sequentially showing a manufacturing process of a display device according to an embodiment of the present invention.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to elucidate the present invention, parts that are not related to the description may be omitted. Like reference numerals designate like elements throughout the specification.

In addition, the size and thickness of each component shown in the drawings are arbitrarily shown for ease of understanding and description, but the present invention is not limited thereto.

In the drawings, the thickness of layers, films, panels, regions, etc., are exaggerated for clarity. In addition, in the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

Next, a manufacturing method of a thin film transistor according to an embodiment of the present invention will be described with reference to FIG. 1 to FIG. 9.

Referring to FIG. 1, a buffer layer 12 and a polysilicon layer 14 are formed on a substrate 10.

Figure 2:
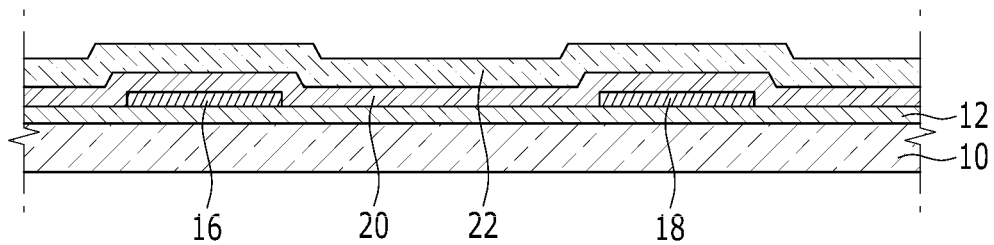

As shown in FIG. 2, a plurality of semiconductor layers are formed from the polysilicon layer 14 through a first patterning process. In embodiments, the semiconductor layers include a first semiconductor layer 16 for an NMOS thin film transistor and a second semiconductor layer 18 for a PMOS thin film transistor.

Subsequently, a gate insulating layer 20 having a predetermined thickness and covering the first semiconductor layer 16 and the second semiconductor layer 18 is formed on the substrate 10, and a metal layer 22 having a predetermined thickness is deposited and formed on the gate insulating layer 20. In embodiments, the metal layer 22 is patterned using a mask into metal layer patterns for gate electrodes (which can be used as mask patterns during doping process), and may be formed with a material generally used for gate electrodes.

Figure 3:
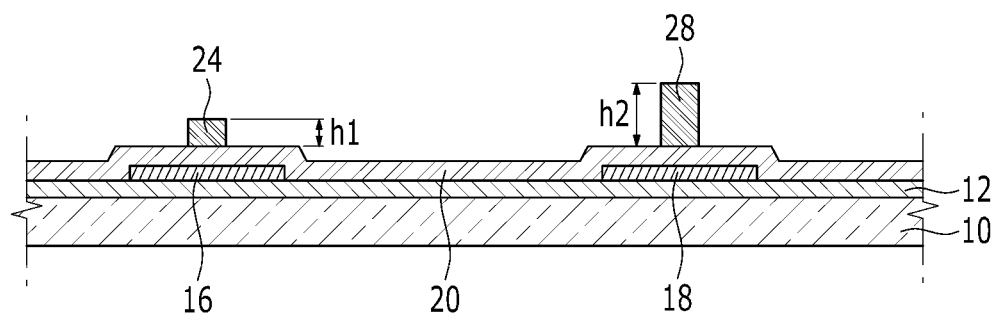

Referring to FIG. 3, the metal layer 22 is patterned into mask patterns including a first mask pattern 24 corresponding to the first semiconductor layer 16 and a second mask pattern 28 corresponding to the second semiconductor layer 18. In the present embodiment, this second patterning process is performed by half-tone exposure using a half-tone mask, and thereby the first mask pattern 24 and the second mask pattern 28 can have different thicknesses. In embodiments, the thickness h1 of the first mask pattern 24 is smaller than the thickness h2 of the second mask pattern 28.

In embodiments, the first mask pattern 24 formed on the gate insulating layer 20 is located right above a region to be dispose between source and drain regions of the first semiconductor layer 16. The second mask pattern 28 formed on the gate insulating layer 20 is located right above a region to be dispose between source and drain regions of the second semiconductor layer 18.

In embodiments, an additional pattern having the substantially same thickness as that of the second mask pattern 24 may be formed on the substrate 10 through the second patterning process, and the additional pattern can form a gate wire or conductor line.

Figure 4:
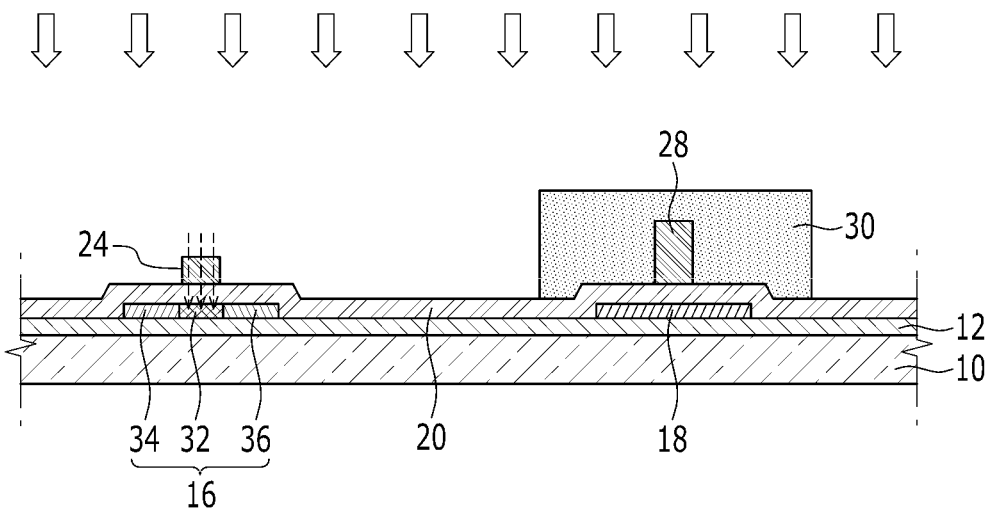

Next, a first ion injection or doping process for channel doping and for forming a source region and a drain region for the first semiconductor layer 16 is performed. In embodiments, as shown in FIG. 4, a photoresist 30 that is patterned to cover the second semiconductor layer 18 and the second mask pattern 28 is formed on the gate insulating layer 20.

In this state, the first ion injection process is performed, and as a result, ions doped to penetrate through the first mask pattern 24 form an active region 32 of the first semiconductor layer 16 and ions doped to penetrate through a portion that is not covered by the first mask pattern 24 form a source region 34 and the drain region 36 of the first semiconductor layer 16. In embodiments, the first ions may be of an n-type or p-type impurity, and they penetrate through the first mask pattern 24 and are then also doped to the active region 32 of the first semiconductor layer 16 such that a threshold voltage Vth of the first thin film transistor may be precisely controlled. In embodiments, the first pattern has a thickness allowing part of ions to penetrate therethrough. In an embodiment, the thickness of the first mask pattern 24 is preferably less than about 1000 Å such that the first ions may penetrate through the first mask pattern 24. As discussed above, the first ion injection process is performed while the first mask pattern 24 functions as a mask.

Accordingly, in embodiments, through the first ion injection process, the doping for the active region and the source/drain regions for the first semiconductor layer 16 is simultaneously accomplished, and this is possible because of the first mask pattern 24 formed through the half-tone exposure.

When the first ion injection process is finished, the photoresist 30 for the second semiconductor layer 18 and the second mask pattern 28 is removed from the gate insulating layer 20, and then the second ion injection or doping process for the second semiconductor layer 18 is performed.

Figure 5:
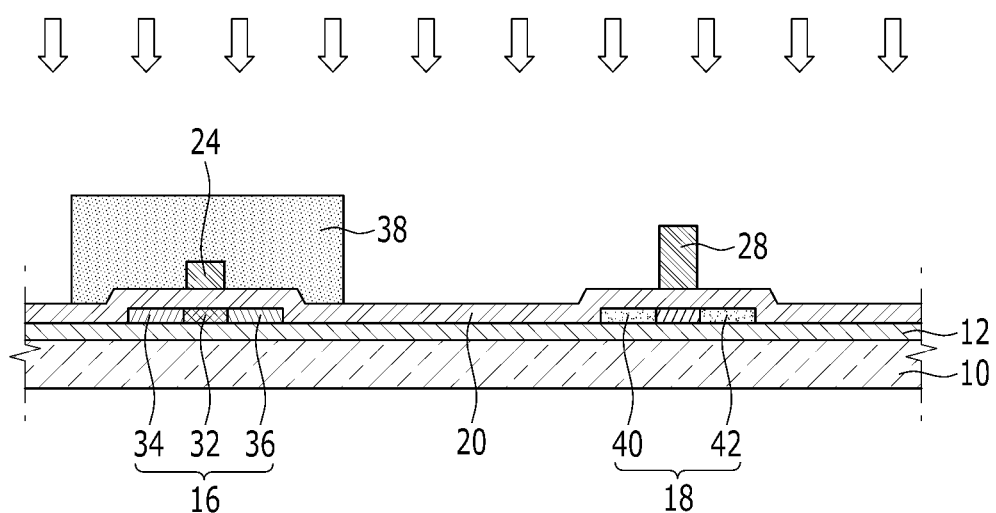

For this, as shown in FIG. 5, a photoresist 38 that is patterned to cover the first semiconductor layer 16 and the first mask pattern 24 is formed on the gate insulating layer 20. In this state, the second ion injection process for the second semiconductor layer 18 is performed. During this process, the second mask pattern 28 functions as a mask for the formation of a source region 40 and a drain region 42 to be formed in the second semiconductor layer 18. The second ions used in the second ion injection process may be of the n-type or the p-type impurity which is different that is used in the first ion injection process. The second mask pattern 28 has a greater thickness (about 1500 to about 3000 Å) than the first mask pattern 24 such that the second ions cannot penetrate through the second mask pattern 28, and as a result, the doped active region is not formed. Thus, the second semiconductor layer 18 has a non-doped region between the source and drain regions. As such, the second ion injection process is performed by using the second mask pattern 28 as a mask.

After the source region 40 and the drain region 42 are formed in the second semiconductor layer 18 through the above process, the photoresist 38 for the first semiconductor layer 16 is removed from the gate insulating layer 20. In the foregoing going embodiments, the first ion doping process is performed before the second ion doping process, but not limited thereto. In alternative embodiments, the second ion doping process can be performed before the first ion doping process.

Upon completion of forming the first and second thin film transistors, the first mask pattern 24 and the second mask pattern 28, respectively corresponding to the first semiconductor layer 16 and the second semiconductor layer 18, are used as a first gate electrode 44 of the first thin film transistor and a second gate electrode 46 the second thin film transistor.

Figure 6:
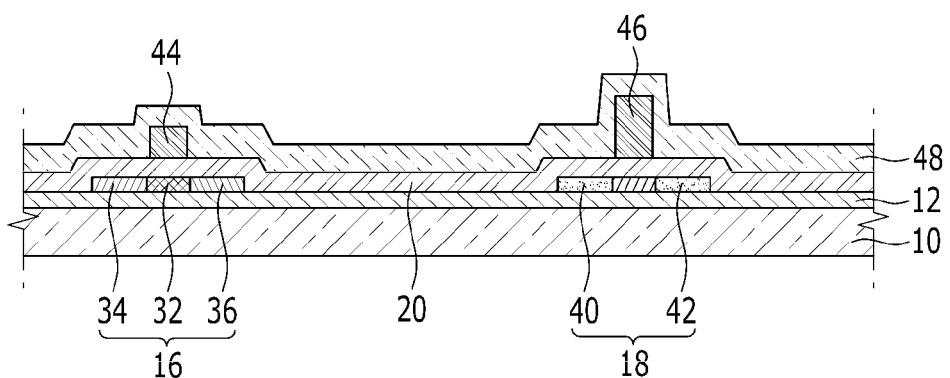
Figure 7:
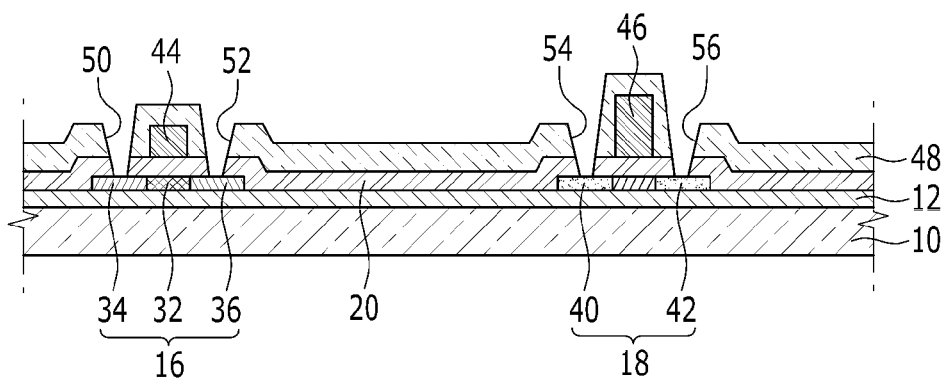
Figure 8:
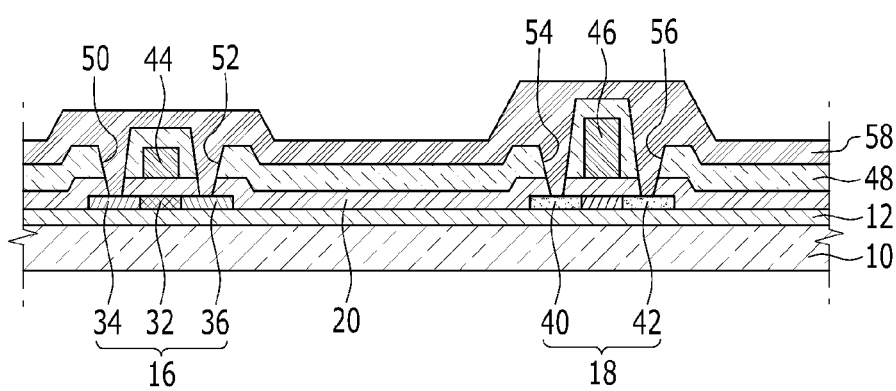

Once the first and second semiconductor layers 16 and 18 and the first and second gate electrodes 44 and 46 are formed on the substrate 10, an interlayer insulating layer 48 covering the first and second gate electrodes 44 and 46 is formed on the gate insulating layer 20 (referring to FIG. 6). The interlayer insulating layer 48 has contact holes 50, 52, 54, and 56 respectively corresponding to the source regions 34 and 40 and the drain regions 36 and 42 formed through the fifth mask process (referring to FIG. 7).

Figure 9:
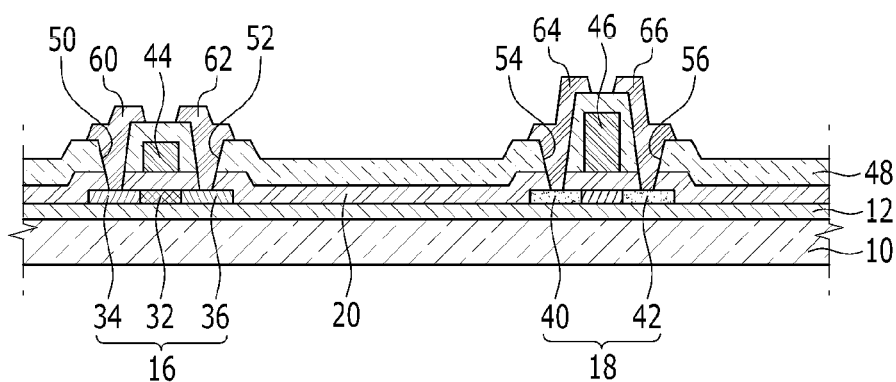

Subsequently, a material layer 58 for source/drain electrodes is formed with a predetermined thickness on the interlayer insulating layer 48 while filling the contact holes 50, 52, 54, and 56 (referring to FIG. 8), and the material layer 58 is patterned to form source electrodes 60 and 64 and drain electrodes 62 and 66 (referring to FIG. 9).

Upon completion of forming a plurality of thin film transistors on the substrate 10, a series of additional processes are performed depending to an organic light emitting diode (OLED) display or a liquid crystal display (LCD).

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

| <Description of Symbols> | |
| --- | --- |
| 10: substrate | 12: buffer layer |
| 16: first semiconductor layer | 18: second semiconductor layer |
| 20: gate insulating layer | 22: metal layer |
| 24: first mask pattern | 28: second mask pattern |
| 30, 38: photoresist | 34, 40: source region |
| 32: active region | 36, 42: drain region |
| 44, 46: gate electrode | |

What is claimed is:

1. A method of manufacturing thin film transistors, the method comprising:
    forming semiconductor layers for a plurality of thin film transistors over a substrate;
    forming an insulating layer covering the semiconductor layers over the substrate;
    forming a metal layer over the insulating layer;
    patterning the metal layer to form mask patterns, each of which corresponds to one of the semiconductor layers;
    doping first ions using only a first mask pattern among the mask patterns into a first semiconductor layer among the semiconductor layers to simultaneously form source region/a drain regions and an active region of a first thin film transistor; and
    doping second ions using only a second mask pattern among the mask patterns into a second semiconductor layer among the semiconductor layers to form a source region and a drain region of a second thin film transistor.

2. The method of claim 1, wherein, when forming the source region/drain region and the active region of the first thin film transistor, the second semiconductor layer and the second mask pattern are covered by a photoresist.

3. The method of claim 1, wherein, when forming the source region and the drain region of the second thin film transistor, the first semiconductor layer and the first mask pattern are covered by a photoresist.

4. The method of claim 1, wherein the first mask pattern has a thickness substantially different from that of the second mask pattern.

5. The method of claim 4, wherein the thickness of the first mask pattern is smaller than that of the second mask pattern.

6. The method of claim 4, wherein the first mask pattern and the second mask pattern are formed by half-tone exposure.

7. The method of claim 1, wherein the first mask pattern and the second mask pattern are formed as a gate electrode of the first thin film transistor and a gate electrode of the second thin film transistor, respectively.

8. The method of claim 1, wherein the first thin film transistor is an NMOS thin film transistor.

9. The method of claim 1, wherein the second thin film transistor is a PMOS thin film transistor.

10. The method of claim 5, wherein a conductive line pattern is formed when patterning the metal layer, and
    wherein the conductor line pattern has a thickness substantially equal to the thickness of the second mask pattern.

11. A display device comprising thin film transistors manufactured by the manufacturing method of the thin film transistor of claim 1,
    wherein a first gate electrode of the first thin film transistor and a second gate electrode of the second thin film transistor are formed of the first mask pattern and the second mask pattern, respectively, and wherein the first gate electrode of the first thin film transistor has a thickness different from that of the second gate electrode of the second thin film transistor.

12. The display device of claim 11, wherein the thickness of the first gate electrode of the first thin film transistor is smaller than that of the second gate electrode of the second thin film transistor.

13. The display device of claim 11, further comprising a conductor line having a thickness substantially same with that of the second gate electrode of the second thin film transistor.

14. The display device of claim 11, wherein the display device is an organic light emitting diode (OLED) display.

15. The display device of claim 11, wherein the display device is a liquid crystal display (LCD).

16. The method of claim 1, wherein the first mask pattern has a thickness smaller than about 1000 Å so as to allow the first ions to travel therethrough.

17. The method of claim 1, wherein the second mask pattern has a thickness of about 1500 Å to about 3000 Å so as to inhibit the second ions from traveling therethrough.

* * * * *